(12) United States Patent
Lee et al.

(10) Patent No.: US 11,776,965 B2
(45) Date of Patent: Oct. 3, 2023

(54) LIGHT EMITTING DISPLAY DEVICE COMPRISING ANODE HAVING AT LEAST ONE OPENING

(71) Applicant: LG Display Co., Ltd., Seoul (KR)

(72) Inventors: Eun-Hyung Lee, Goyang-si (KR); Soo-Won Hwang, Goyang-si (KR); In-Seop Jung, Jinju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 113 days.

(21) Appl. No.: 17/131,274

(22) Filed: Dec. 22, 2020

(65) Prior Publication Data

US 2021/0202536 A1 Jul. 1, 2021

(30) Foreign Application Priority Data

Dec. 31, 2019 (KR) .................. 10-2019-0180202

(51) Int. Cl.
*H10K 50/818* (2023.01)
*H01L 27/12* (2006.01)
*H10K 50/15* (2023.01)
*H10K 50/16* (2023.01)
*H10K 50/17* (2023.01)

(52) U.S. Cl.
CPC ......... *H01L 27/1218* (2013.01); *H10K 50/15* (2023.02); *H10K 50/16* (2023.02); *H10K 50/171* (2023.02); *H10K 50/818* (2023.02)

(58) Field of Classification Search
CPC .................................................. H01L 51/5209
See application file for complete search history.

(56) References Cited

U.S. PATENT DOCUMENTS

2002/0180372 A1* 12/2002 Yamazaki ........... H01L 51/5209
315/169.3
2017/0179418 A1* 6/2017 Lee ..................... H01L 51/5016

FOREIGN PATENT DOCUMENTS

KR 10-2005-0050844 A 6/2005
KR 10-2016-0025327 A 3/2016

* cited by examiner

*Primary Examiner* — Daniel Whalen
(74) *Attorney, Agent, or Firm* — Morgan, Lewis & Bockius LLP

(57) ABSTRACT

A light emitting display device includes a substrate including first subpixels, second subpixels and third subpixels; a first anode, having at least one opening, in each of the first subpixels; a second anode in each of the second subpixels, and a third anode in each of the third subpixels; a reflective insulating film at the opening of the first anode to contact the first anode under the first anode; an organic stack on each of the first anode, the second anode and the third anode; and a cathode on the organic stack.

20 Claims, 11 Drawing Sheets

LIGHT EMITTING DISPLAY DEVICE COMPRISING ANODE HAVING AT LEAST ONE OPENING

This application claims the benefit of Korean Patent Application No. 10-2019-0180202, filed on Dec. 31, 2019, which is hereby incorporated by reference as if fully set forth herein.

BACKGROUND

Technical Field

The present disclosure relates to a light emitting display device, and more particularly, to a light emitting display device which prevents non-uniformity of colors at low grayscale values and improves poor image quality by adjusting an efficiency difference between low grayscale values and high grayscale values according to colors of emitted light through change of an anode structure.

Discussion of the Related Art

As society has recently entered the information age, the field of displays for visually displaying electrical information signals has rapidly developed and, in order to satisfy such development, various flat display devices having excellent performance, such as slimness, light weight and low power consumption, have been developed and have rapidly replaced conventional cathode ray tubes (CRTs).

As examples of such display devices, there are a liquid crystal display (LCD) device, a plasma display panel (PDP) device, a field emission display (FED) device, an organic light emitting diode (OLED) display device, a quantum dot display device, etc.

Thereamong, a light emitting display device, which does not require a separate light source and achieves compactness and clear color display, is considered as a competitive application.

Such a light emitting display device includes a plurality of subpixels, and a light emitting element is provided in each of the subpixels, thus emitting light without a separate light source.

The light emitting element is greatly influenced by the efficiency of a luminescent material thereof, and has difficulty achieving uniform efficiency depending on the color of the emitted light.

SUMMARY

Accordingly, embodiments of the present disclosure are directed to a light emitting display device that substantially obviates one or more problems due to limitations and disadvantages of the related art.

An object of the present disclosure is to provide a light emitting display device which prevents non-uniformity of colors at low grayscale values and improves poor image quality by adjusting an efficiency difference between low grayscale values and high grayscale values according to colors of emitted light through change of an anode structure.

Another object of the present disclosure is to provide a light emitting display device in which an opening is formed in an anode of a designated light emitting part so as to compensate for an efficiency difference with light emitting layers of other colors due to current spreading effects.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting element comprises an anode having at least one opening, a reflective insulating film provided at the opening of the anode, an organic stack provided on the reflective insulating film, provided at the opening, and the anode, and a cathode provided on the organic stack.

In another aspect, a light emitting display device comprises a substrate including first subpixels, second subpixels and third subpixels, a first anode, having at least one opening, provided in each of the first subpixels, a second anode provided in each of the second subpixels and a third anode provided in each of the third subpixels, a reflective insulating film provided at the opening of the first anode and configured to contact the first anode under the first anode, an organic stack provided on each of the first anode, the second anode and the third anode, and a cathode provided on the organic stack.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Figure 1:
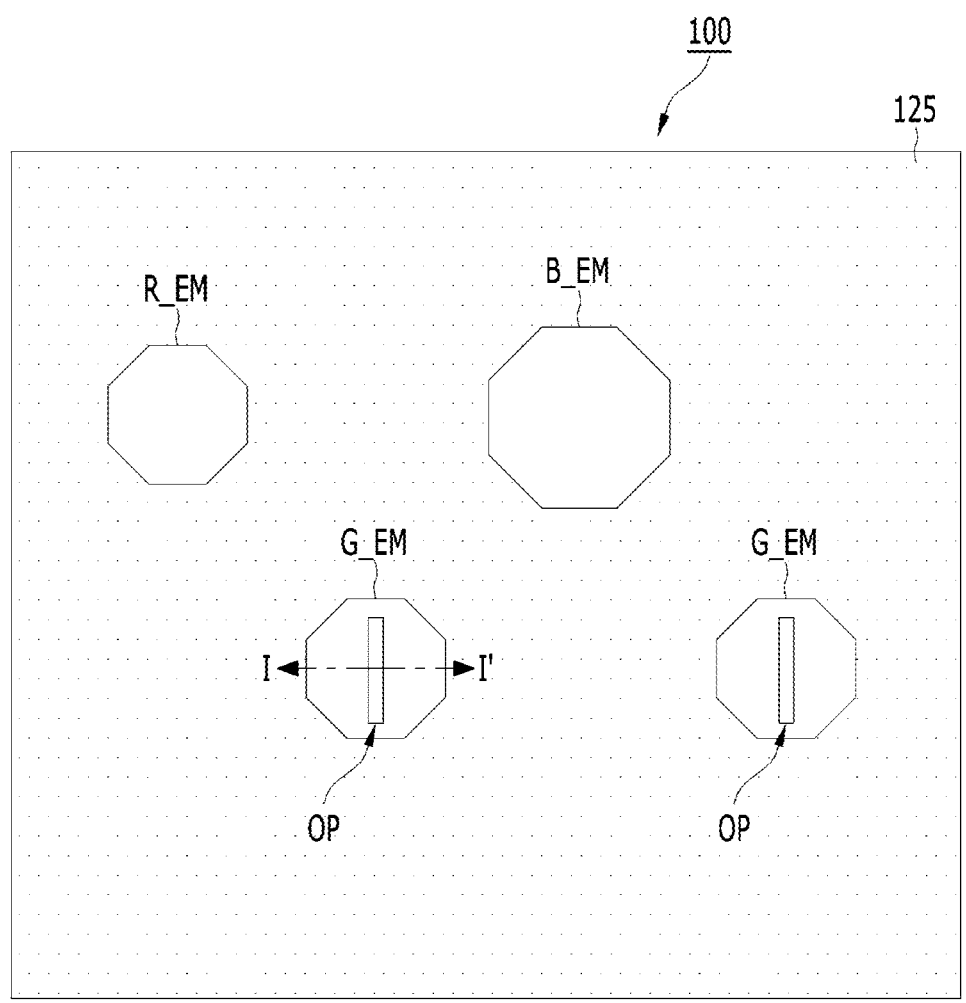
FIG. 1 is a plan view illustrating a light emitting display device according to a first embodiment of the present invention.

Reference will now be made in detail to the exemplary embodiments of the present disclosure, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease of preparation of the specification, and may thus differ from the names of parts of an actual product.

Shapes, sizes, rates, angles and numbers disclosed in the drawings to describe the embodiments of the present invention are only exemplary and do not limit the present invention. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is "on", "above", "under" or "beside" another element, the two elements may directly contact each other, or one or more other elements may be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to discriminate the same or similar elements. Therefore, a first element described hereinafter may be a second element without departing from the technical scope of the invention.

Respective features of the various embodiments of the present invention may be partially or wholly coupled to or combined with each other and be interlocked or driven in various technical manners, and the respective embodiments may be implemented independently of each other or be implemented together through connection therebetween.

Figure 2:
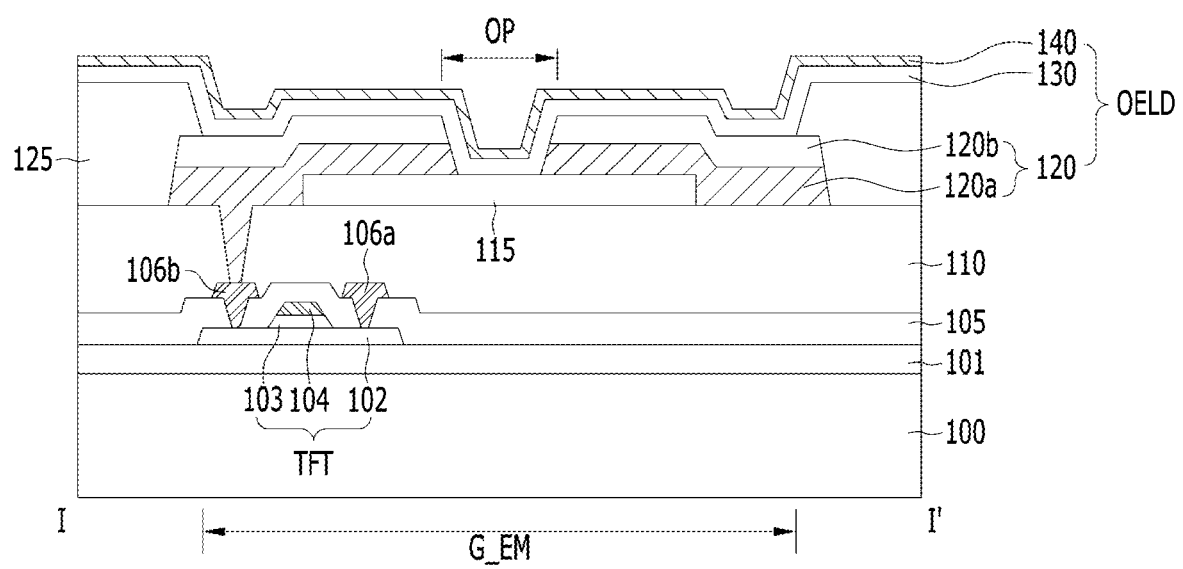
FIG. 2 is a cross-sectional view taken along line I-I' of FIG. 1.
Figure 3:
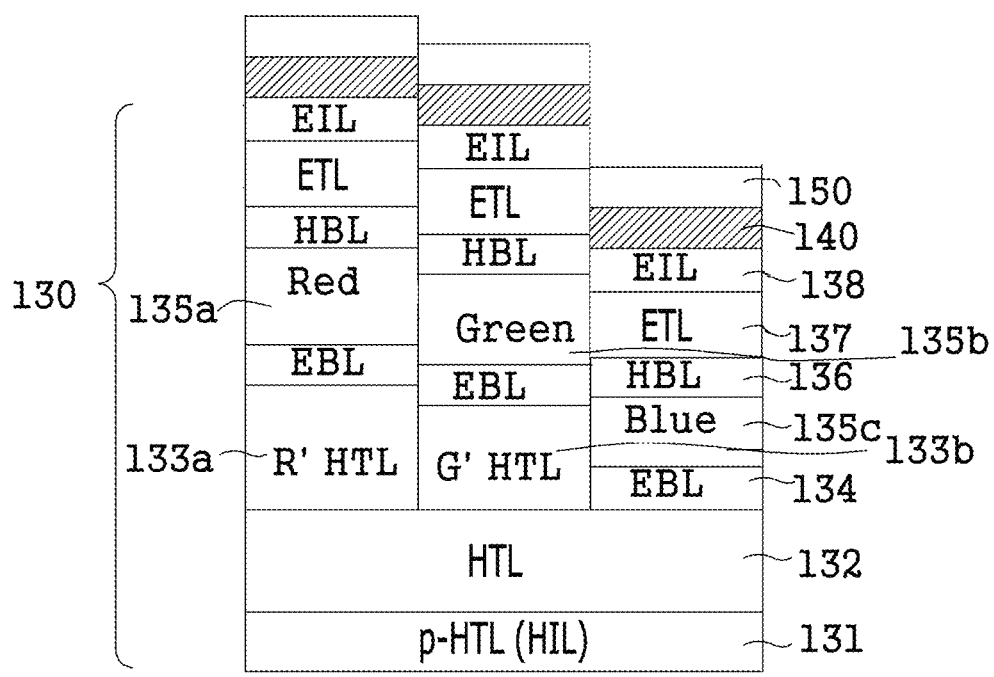
FIG. 3 is a cross-sectional view illustrating light emitting elements in a red light emitting part, a green light emitting part and a blue light emitting part of the light emitting display device of FIG. 1.

FIG. 1 is a plan view illustrating a light emitting display device according to a first embodiment of the present invention, and FIG. 2 is a cross-sectional view taken along line I-I' of FIG. 1. FIG. 3 is a cross-sectional view illustrating light emitting elements in a red light emitting part, a green light emitting part and a blue light emitting part of the light emitting display device of FIG. 1.

As shown in FIGS. 1 and 2, the light emitting display device according to the present invention includes first light emitting parts R_EM, second light emitting parts G_EM and third light emitting parts B_EM which emit light of different colors, on a substrate 100.

A bank 125 is configured to be provided between the first to third light emitting parts R_EM, G_EM and B_EM, and the respective first to third light emitting parts R_EM, G_EM and B_EM are exposed through open areas of the bank 125. Here, a subpixel SP means an area including each light emitting part R_EM, G_EM or B_EM and a region of of the bank 125 around each light emitting part R_EM, G_EM or B_EM.

FIG. 1 illustrates the case in which a red light emitting part R_EM, a green light emitting part G_EM, a blue light emitting part B_EM and another green light emitting part G_EM are arranged from left, i.e., the case in which a larger number of the green light emitting parts G_EM is provided. The reason for this is that in order to display white light, dependence on green light is relatively high. As circumstances require, the weighting of arrangement of light emitting parts of colors may be varied according to the desired color characteristics of the light emitting display device.

Further, the reason why the area of the blue light emitting part B_EM in FIG. 1 is relatively great is that the efficiency of a blue luminescent material is lower than those of green and red luminescent materials at present, and if a new blue luminescent material having improved efficiency is developed, the respective light emitting parts R_EM, G_EM and B_EM may have the same area.

The respective light emitting parts R_EM, G_EM and B_EM are illustrated as having an octagonal shape, but this shape is only one example and the respective light emitting parts R_EM, G_EM and B_EM may have a circular shape, an oval shape, one of other polygonal shapes, or a shape having rounded corners. However, as the shape of the respective light emitting parts R_EM, G_EM and B_EM becomes nearly a circle, symmetry thereof is excellent and current spreading effects are excellent, and thus, an anode 120 having an opening OP may have a circular shape or a polygonal shape closely resembling a circle.

Each of the light emitting parts R_EM, G_EM and B_EM includes the anode 120, an organic stack 130 and a cathode 140 which are sequentially provided from below.

The organic stack 130 may include, for example, a hole injection layer, a hole transport layer, a light emitting layer, an electron transport layer and an electron injection layer.

The light emitting display device according to the present invention includes an opening OP provided in the second light emitting part G_EM so as to deform the second light emitting part G_EM, thereby compensating for a color-dependent difference in efficiency at low grayscale values.

The reason why the opening OP is provided in the second light emitting part G_EM is that, among materials of light emitting layers of different colors, the material of the green light emitting layer has the highest efficiency, particularly, at low grayscale values.

This embodiment illustrates an example in which the opening OP is provided in the green light emitting part G_EM, but, if the material of the light emitting layer of a color other than green has higher efficiency, the opening OP may be formed in the anode of another light emitting part, corresponding thereto.

The light emitting display device according to the preset invention is characterized in that, in a structure including light emitting parts having an efficiency difference therebetween, the efficiency difference is compensated for by providing an opening in the anode of a light emitting part having higher efficiency than light emitting parts of other colors, so that colors are uniformly expressed without a noticeable color difference between low grayscale values and high grayscale values.

For this purpose, a light emitting element OLED of the light emitting part having the opening OP may include the anode 120 having at least one opening OP, a reflective insulating film 115 provided at the opening OP of the anode 120, the organic stack 130 provided on the reflective insulating film 115, provided at the opening OP, and the anode 120, and the cathode 140 provided on the organic stack 130, as shown in FIG. 2.

The reflective insulating film 115 may overlap the anode 120, and the reflective insulating film 116 may contact the anode 120 under the anode 120.

The anode 120 may include a stack of a reflective electrode 120a and a transparent electrode 120b.

In another example, if the light emitting display device is implemented as a transparent display device, the anode 120 may be a single transparent electrode, and only a transparent insulating film may be provided at the opening OP. In this case, the components of the transparent insulating film provided at the opening OP may be adjusted so as to realize transparency similar to that of a transparent electrode.

As described above, the second light emitting part G_EM having the above-described opening OP in the light emitting element OLED may be the green light emitting part.

Although the embodiment shown in FIG. 1 describes that one opening OP is formed in a linear shape in the anode 120, the shape of the opening OP may be changed to various shapes which will be described below.

Voltage is not applied to the region of the anode 120 in which the opening OP is located, and thus, in order to exhibit uniform current spreading effects in regions other than the opening OP, the opening OP may be located at the center of the anode 120.

Further, the reflective electrode 120a is removed from the opening OP, and thus, in order to maintain the optical effects of the opening OP of the light emitting part G_EM at a level equal or similar to that of the anode 120, the reflective insulating film 115 is arranged at the opening OP.

The reflective insulating film 115 may be formed, for example, by alternately stacking two films having different refractive indices into a plurality of pairs, and may thus acquire reflection efficiency equal or similar to that of the anode 120.

The reflective electrode 120a used in the anode 120 may be formed of, for example, aluminum, an aluminum alloy, silver, a silver alloy, APC or the like, and the transparent electrode 120b may be formed of an oxide film including at least two of indium, zinc, tin or titanium.

The reflective insulating film 115 may be an organic insulating film to which voltage is not applied, i.e., an oxide film or a nitride film, and include silicon or titanium so as to adjust a refractive index thereof. In an example of the reflective insulating film 115 implemented by the inventors of the present invention, it was confirmed that the reflective insulating film 115 may be formed to a thickness of 5,000 Å by alternately staking a first film formed of $TiO_2$ having a refractive index in the range of 2.5 to 2.65 and a second film formed of $SiO_2$ having a refractive index in the range of 1.4 to 1.5 into 20 pairs, and thereby, the reflective insulating film 115 may have reflectance of a level equal or similar to that of silver.

The above reflective insulating film 115 is only an example, and films having different refractive indices may be alternately stacked into a plurality of pairs and thus be implemented in various forms.

The substrate 100 may include a base material and a thin film transistor array.

Each anode 120 may be connected to a thin film transistor TFT.

For example, the thin film transistor TFT may include a semiconductor layer 102 formed on a buffer layer 101, a gate insulating film 103 and a gate electrode 104 which are sequentially formed to partially overlap the semiconductor layer 102, and a source electrode 106a and a drain electrode 106b which are connected to both sides of the semiconductor layer 102.

An interlayer insulating film 105 may be further formed between the gate insulating film 103 and gate electrode 104 and the source and drain electrodes 106a and 106b, and as circumstances require, a coplanar structure may be applied to the thin film transistor TFT by omitting the interlayer insulating film 105 and forming the gate electrode 104 and the source and drain electrodes 106a and 106b in the same layer.

The semiconductor layer 102 may be formed of, for example, an oxide semiconductor, amorphous silicon, polycrystalline silicon, or a combination of two or more thereof.

Further, a planarization film 107 may be provided on the thin film transistors TFTs, and the anodes 120 may be provided on the planarization film 107.

Each anode 120 may be connected to the drain electrode 106b of the thin film transistor TFT.

Hereinafter, the configuration of the organic stack 130 of each of the light emitting parts R_EM, G_EM and B_EM will be described.

The organic stack 130 includes a hole injection layer 131, a hole transport layer 132, an electron blocking layer 134, a light emitting layer 135a, 135b or 135c, a hole blocking layer 136 and an electron transport layer 137 in each of the red light emitting part R_EM, the green light emitting part G_EM and the blue light emitting part B_EM.

An electron injection layer 138 may be formed between the electron transport layer 137 and the cathode 140, and the electron injection layer 138 may be regarded as an element of the cathode 120 or an element of the organic stack 130 according to whether components included in the electron injection layer 138 are organic or inorganic.

Further, a capping layer 150 may be further formed on the cathode 140 so as to extract light and protect the light emitting element OLED.

Here, since a light emitting part having a relatively long wavelength has a long resonance length between an anode and a cathode, the red light emitting part R_EM and the green light emitting part G_EM respectively include first and second auxiliary hole transport layers 133a and 133b, unlike the blue light emitting part B_EM, and thereby, the positions of the respective light emitting layers 135a, 135b and 135c may be adjusted. Further, the first auxiliary hole transport layer 133a under the red light emitting layer 135a may have a greater thickness than that of the second auxiliary hole transport layer 133b under the green light emitting layer 135b.

The electron blocking layer 134 and the hole blocking layer 136 do not deviate from each of the light emitting layers 135a, 135b and 135c, and thus function to limit electrons and holes to the inside of the corresponding light emitting layer 135a, 135b or 135c. As circumstances require, the electron blocking layer 134 and the hole blocking layer 136 may be omitted, and the hole transport layer 132, the auxiliary hole transport layer 133a or 133b, or the electron transport layer 137 may perform the functions thereof.

As shown in FIG. 1, a larger number of green subpixels than the number of each of subpixels of other colors are provided on the substrate 100, and thus, dependence of display of white light on green light may be increased. Since currently known green phosphorescent materials have higher efficiency than phosphorescent materials of other colors, increasing the number of the green light emitting parts G_EM is more effective than increasing the number of each of light emitting parts of other colors in terms of improvement in efficiency of white light.

Figure 4:
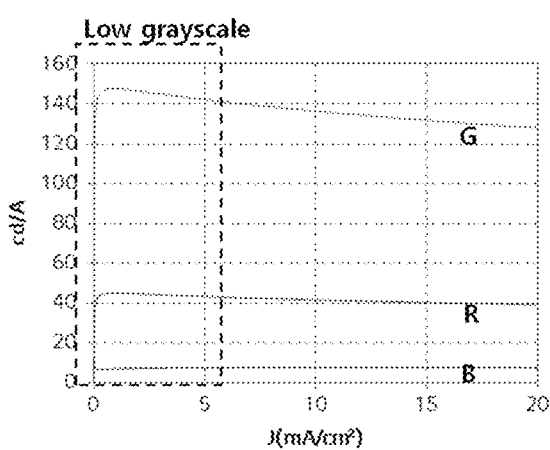
FIG. 4 is a graph showing luminance efficiencies according to current densities of green, red and blue when a uniform anode shape is applied.

FIG. 4 is a graph showing luminance efficiencies according to current densities of green, red and blue when a uniform anode shape is applied.

The graph of FIG. 4 shows that, when the uniform anode shape is applied, efficiencies of red and blue are lower than efficiency of green at a low current density, and an efficiency difference therebetween is gradually decreased as the current density is increased.

When the uniform anode shape is applied, green may be more noticeable than other colors in low grayscale expression, and thereby, poor image quality at low grayscale values may result.

The inventors of the present invention suggests change in the shape of the anode of a light emitting part having higher efficiency than light emitting parts of other colors at low grayscale values so as to compensate for a color efficiency difference at low grayscale values.

Hereinafter, various embodiments will be described.

Figure 5A:
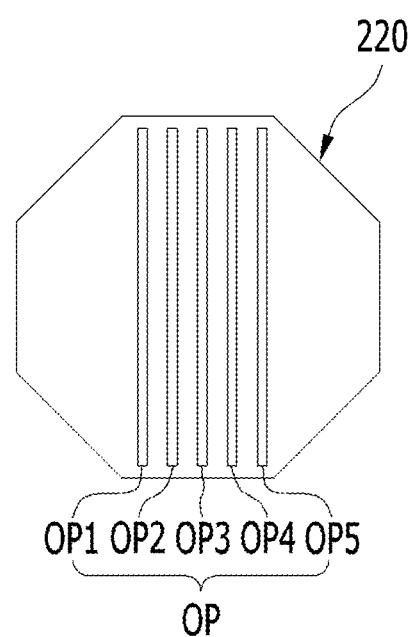
FIG. 5A to 5C are plan views illustrating anodes of light emitting display devices according to second and fourth embodiments of the present invention.
Figure 5B:
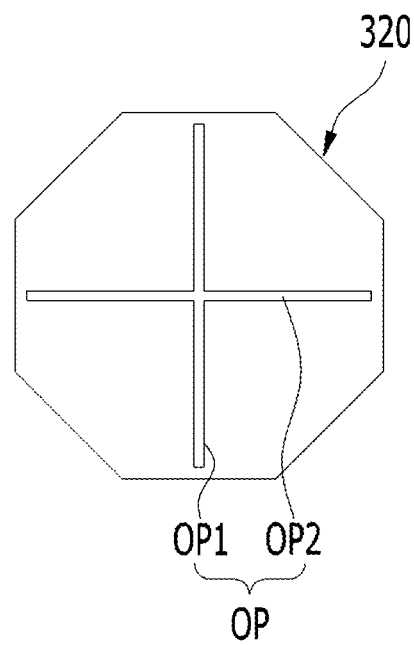
Figure 5C:
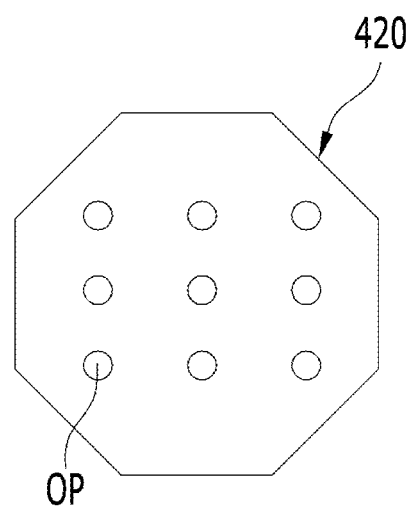

FIG. 5A to 5C are plan views illustrating anodes of light emitting display devices according to second and fourth embodiments of the present invention.

As shown in FIG. 5A, in the light emitting display device according to the second embodiment of the present invention, openings OP1-OP5 formed in an anode 220 of a light emitting part EM may be a plurality of linear-shaped slits which are spaced apart from each other by the same interval. The openings OP1-OP5 may be formed by selectively removing the anode 220. In order to exhibit current spreading effects in the anode 220 having the openings OP1-OP5, portions of the anode 220 located at the edges of the openings OP1-OP5 are connected.

As shown in FIG. 5B, in the light emitting display device according to the third embodiment of the present invention, an opening OP formed in an anode 320 may be formed in a cross shape in which a first opening part OP1 formed in a vertical direction and a second opening part OP2 formed in a horizontal direction are connected.

In this case, in order to exhibit current spreading effects in the anode 320, portions of the anode 320 located around the opening OP are connected.

As shown in FIG. 5C, in the light emitting display device according to the fourth embodiment of the present invention, a plurality of dot-shaped openings OP formed in an anode 420 may be regularly arranged so as to be spaced apart from each other.

Figure 6:
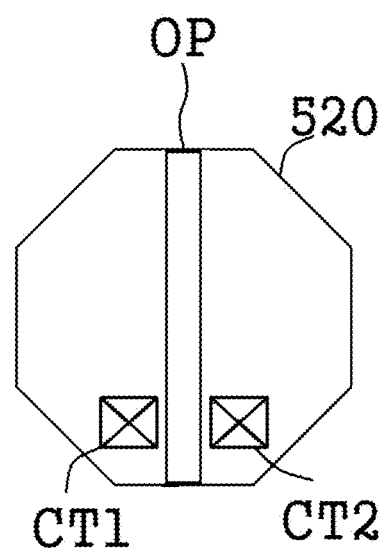
FIG. 6 is a plan view illustrating an anode of a light emitting display device according to a fifth embodiment of the present invention.

FIG. 6 is a plan view illustrating an anode of a light emitting display device according to a fifth embodiment of the present invention.

As shown in FIG. 6, the light emitting display device according to the fifth embodiment of the present invention uses a method in which an anode 520 is divided into two parts by an opening OP but the two parts are connected to a thin film transistor TFT through first and second connectors CT1 and CT2 so that the same voltage is applied to the two parts of the anode 520. In this case, although the anode 520 is divided into the two parts by the opening OP, the two parts are connected to the thin film transistor TFT through the first and second connectors CT1 and CT2 and may thus be operated by receiving the same driving current. Further, a reflective insulating film 115 is provided under the opening OP in the same manner as in FIG. 2, and thus the anode 520 and the reflective insulating film 115 may have the same or similar light reflecting effects.

Figure 7:
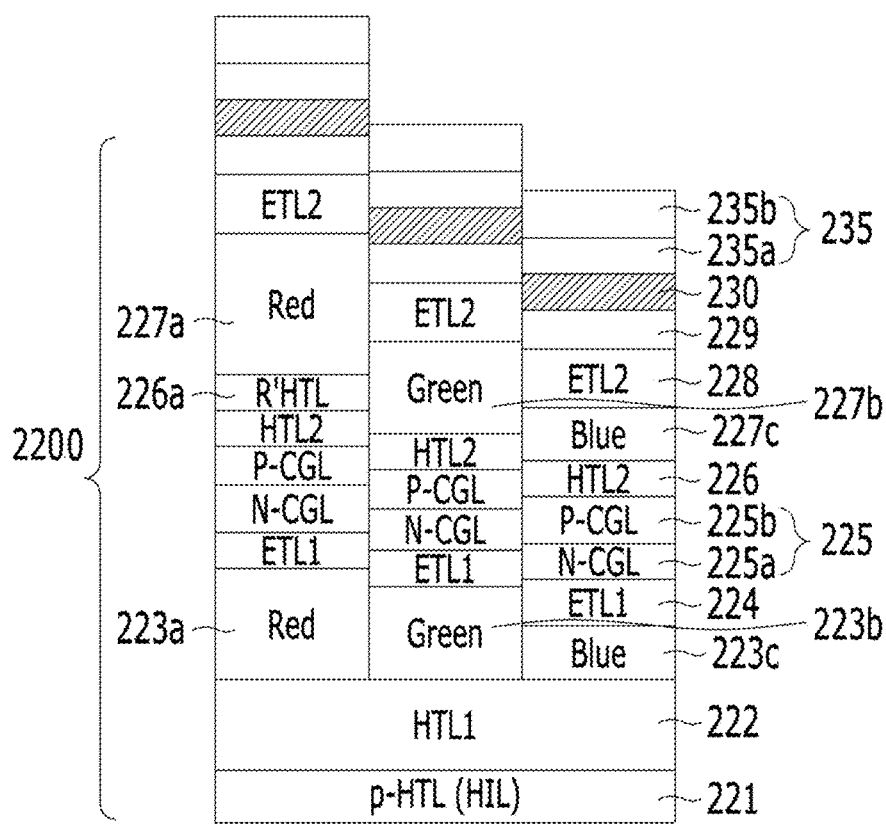
FIG. 7 is a cross-sectional view of a light emitting display device according to a sixth embodiment of the present invention.

FIG. 7 is a cross-sectional view of a light emitting display device according to a sixth embodiment of the present invention.

As shown in FIG. 7, in the light emitting display device according to the sixth embodiment of the present invention, an organic stack 2200 of each subpixel has a double-stack structure between an anode (not shown) and a cathode 230. Upper and lower stacks are provided with a charge generation layer 225 interposed therebetween, and the upper and lower stacks in each subpixel include the same light emitting layers 223a and 227a, 223b and 227b, or 223c and 227c, respectively.

In addition to the structure of the illustrated embodiment, the organic stack 2200 may include three or more stacks including the same light emitting layers for the same purpose.

Here, reference numeral 221 indicates a hole injection layer, reference numerals 222 and 226 indicate hole transport layers, reference numeral 226a indicates an auxiliary hole transport layer, reference numerals 224 and 228 indicate electron transport layers, reference numeral 229 indicates an electron injection layer, and these layers, other than the auxiliary hole transport layer 226a, are formed as common layers in the respective subpixels. Further, reference numeral 235 indicates a capping layer, and the capping layer 235 includes an organic capping layer 235a and an inorganic capping layer 235b.

Figure 8:
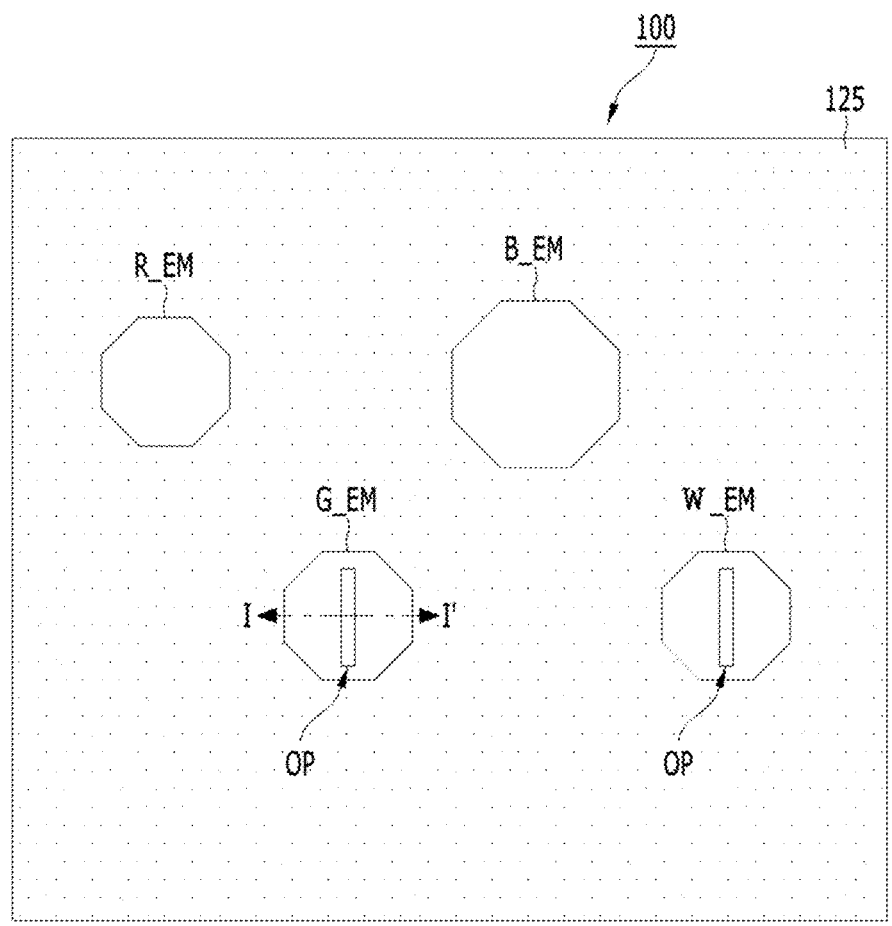
FIG. 8 is a plan view of a light emitting display device according to a seventh embodiment of the present invention.

FIG. 8 is a plan view of a light emitting display device according to a seventh embodiment of the present invention.

As shown in FIG. 8, in the light emitting display device according to the seventh embodiment of the present invention, an opening OP may be provided not only in a green light emitting part G_EM but also in a white light emitting part W_EM, thereby being capable of compensating for an efficiency difference with other colors at low grayscale values.

Hereinafter, tests, which were performed by the inventors of the invention to verify compensation of efficiency at low grayscale values depending on whether or not an opening is formed in an anode, will be described.

Figure 9:
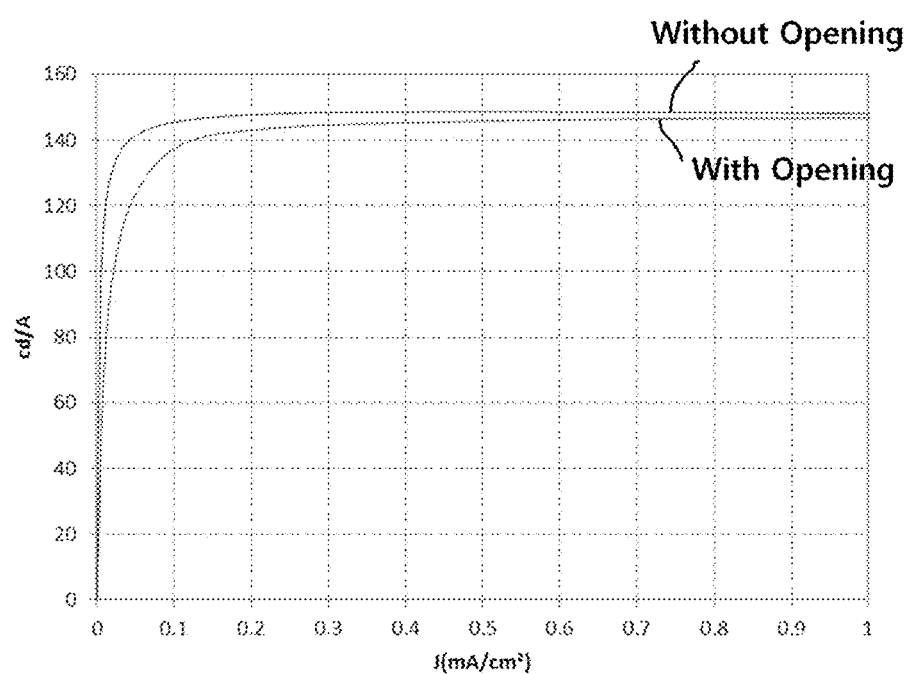
FIG. 9 is a graph showing efficiency change at a low current density depending on whether or not an opening is implemented.

FIG. 9 is a graph showing efficiency change at a low current density depending on whether or not an opening is implemented.

From FIG. 9, it may be confirmed that, when an opening is formed in an anode, efficiency at low current densities of less than $0.1$ $mA/cm^2$ is lowered. On the other hand, it may be confirmed that there is no efficiency difference between the case in which an opening is formed in an anode and the case in which no opening is formed in an anode, at current densities of more than $0.1$ $mA/cm^2$. This means that a light emitting part having an opening formed in an anode lowers efficiency which is higher than those of light emitting parts of other colors having no opening only at low grayscale values and maintains efficiency which is similar to those of light emitting parts of other colors having no opening at high grayscale values, and may thus prevent efficiency loss at high grayscale values and compensate for an efficiency difference between colors at low grayscale values.

Subsequently, the inventors of the invention applied driving voltages of 2.5 V and 5 V to the anode having the opening shown in FIGS. 1 and 2, and evaluated whether or not excitons are generated in the opening when driving voltages of 2.5 V and 5 V were applied to the anode.

When a driving voltage of 2.5 V was applied to the anode, no exciton was generated in the opening, but when a driving voltage of 5 V was applied to the anode, excitons were generated in the opening. That is, this means that, when the anode is driven at a voltage of 5V or higher, i.e., at high grayscale values, current is generated in the opening and a light emitting layer provided between the anode and the cathode of the corresponding light emitting part may emit light without distinguishing between regions of the light emitting layer regardless of whether or not the opening is present, and loss of efficiency is not caused at high grayscale values.

Hereinafter, it will be confirmed that a reflective electrode and a reflective insulating film have reflection characteristics that are optically similar to each other.

Figure 10:
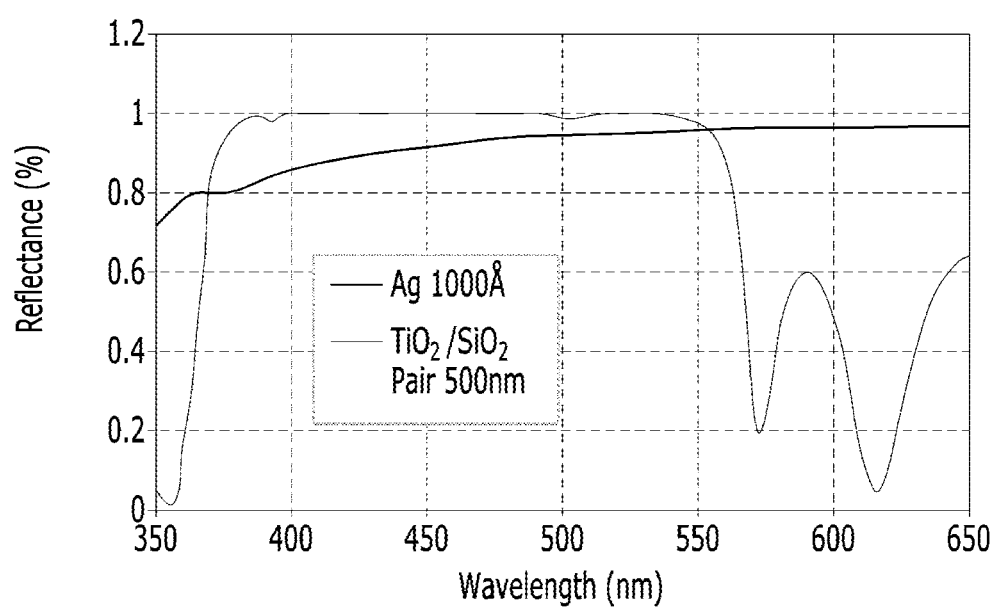
FIG. 10 is a graph illustrating changes in reflectances of a reflective electrode and a reflective insulating film depending on wavelengths.

FIG. 10 is a graph illustrating changes of reflectances of a reflective electrode and a reflective insulating film depending on wavelengths.

As shown in FIG. 10, as a test example, a reflective electrode 120 (in FIG. 2) was formed of silver (Ag) to a thickness of 1,000 Å, and a reflective insulating film 115 (in FIG. 2) was formed to a total thickness of 500 nm by alternately depositing a $TiO_2$ film and a $SiO_2$ film into a plurality of pairs (20 pairs).

Here, it may be confirmed that the reflectance of the reflective insulating film is higher than that of the reflective electrode in a visible light range, particularly, in the range of green wavelengths or shorter. That is, in the light emitting display device of the present invention, it may be confirmed that, if the reflective insulating film is provided under the opening of the anode, a corresponding light emitting part maintains reflectance equal to or higher than that of a light emitting part having a reflective electrode not provided with an opening, and may thus acquire current compensation effects due to the opening without optical loss.

Particularly, the opening is not provided in all of the anodes, and is provided only in the anode of a light emitting part having high efficiency at low grayscale values, and, for example, when a green or blue light emitting part includes an anode provided with an opening, the reflective insulating film is provided under the anode and thereby the opening of the green or blue light emitting part may acquire reflectance efficiency equal to that of the reflective electrode.

Figure 11:
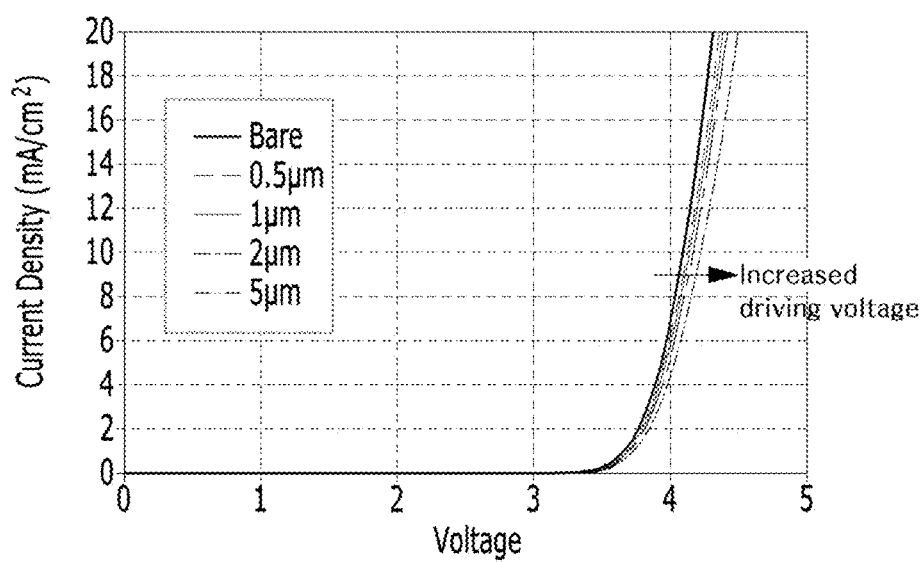
FIG. 11 is a graph illustrating changes in driving voltage depending on the widths of an anode opening according to the present invention.

FIG. 11 is a graph illustrating changes in driving voltage depending on the widths of an anode opening according to the present invention.

As shown in FIG. 11, as results of evaluation in which driving voltage according to current density was measured when no opening was provided (Bare) and when the width of an opening was varied to 0.5 µm, 1 µm, 2 µm and 5 µm, it may be confirmed that, as the size of the opening is increased, the driving voltage is increased. However, driving voltage differences at a low current density are insignificant, and driving voltage differences even at a high current density are 0.3 V or lower, and thereby, it may be confirmed that, when a current density typically used in a display device is implemented, if the width of the opening is set to 5 µm, any increase in driving voltage hardly occurs.

In consideration of these test results, the width of the opening formed in the anode of the present invention may be in the range of 0.1 µm to 5 µm. The reason why the width of the opening has the lower limit of 0.1 µm is to compensate for an efficiency difference between colors at low grayscale values and to consider possibility of a patterned opening, and the reason why the width of the opening has the upper limit of 5 µm is to prevent an increase in driving voltage.

The light emitting display according to the present invention, when the opening structure of the anode is implemented, if transmittance of an insulating layer under a region, in which current spreading occurs, is properly increased by forming the anode of a transparent electrode and omitting the reflective insulating film, may achieve target transmittance and efficiency of a transparent display, thus being capable of being applied to relevant products.

The light emitting display device according to the present invention adjusts the area of a light emitting part formed of a luminescent material having high efficiency due to the shape of the anode, thereby improving uniformity of colors at low grayscale values.

Further, an opening is formed in the anode of a designated light emitting part, and thus, selective reduction in luminous efficacy of a corresponding color at low grayscale values may be achieved. Thereby, the corresponding light emitting part has luminous efficacy that is balanced with the luminous efficiency of light emitting parts of other colors at low grayscale values and high grayscale values, and thus, luminance deviation at low grayscale values may be prevented.

Further, the corresponding light emitting part further includes a reflective insulating film in a region from which the anode is removed due to the opening, thereby being capable of maintaining optical reflectance and thus maintaining optical balance with the light emitting parts of other colors.

The opening provided to compensate for an efficiency difference between colors at low grayscale values is set to have a designated width or less, and thus, does not cause an increase in driving voltage and maintains a potential similar to a case in which no opening is provided at high grayscale values, thereby being capable of preventing efficiency loss at high grayscale values.

A light emitting display device according to one embodiment of the present invention may include a substrate including first subpixels, second subpixels and third subpixels, a first anode, having at least one opening, formed in each of the first subpixels, a second anode provided in each of the second subpixels, and a third anode provided in each of the third subpixels, an insulating film provided at the opening of the first anode, an organic stack provided on each of the first anode, the second anode and the third anode, and a cathode provided on the organic stack.

The insulating film may overlap the first anode, and contact the first anode under the first anode.

The insulating film may be reflective insulating film.

The reflective insulating film may be formed by stacking a first film and a second film having different refractive indices into a plurality of pairs.

The reflective insulating film may overlap the first anode, and contact the first anode under the first anode.

The reflective insulating film may be one of an oxide film and a nitride film, and include one of silicon and titanium.

Each of the first to third anodes may include a stack of a reflective electrode and a transparent electrode.

The at least one opening of the first anode may include a plurality of linear-shaped openings spaced apart from each other by the same interval.

The at least one opening of the first anode may be provided in a radial shape from the center of the first anode.

The at least one opening of the first anode may include a plurality of dot-shaped openings.

The first anode may be divided by the at least one opening.

The at least one opening of the first anode may have a width within a range of 0.1 µm to 5 µm.

The organic stack may include a hole injection layer, a hole transport layer, an electron blocking layer, a light emitting layer, a hole blocking layer and an electron transport layer in each of the first to third subpixels, the light emitting layer of each of the first subpixels may be a green light emitting layer, and the light emitting layer of each of the second subpixels and the light emitting layer of each of the third subpixels may be a red light emitting layer and a blue light emitting layer, respectively.

The number of the first subpixels arranged on the substrate may be greater than the number of each of the second and third subpixels arranged thereon.

The organic stack in the first and second subpixels may further include first and second auxiliary hole transport layers arranged between the hole transport layer and the electron blocking layer, respectively, and the thickness of the second auxiliary hole transport layer may be greater than the thickness of the first auxiliary hole transport layer.

As is apparent from the above description, a light emitting display device according to the present invention has the following effects.

First, the area of a light emitting part formed of a luminescent material having high efficiency due to the shape of an anode, thereby improving uniformity of colors at low grayscale values.

Second, through the opening formed in the anode of a designated light emitting part, reduction in luminous efficacy of a corresponding color at low grayscale values may be achieved. Thereby, the corresponding light emitting part has luminous efficacy that is balanced with the luminous efficiency of light emitting parts of other colors at low grayscale values and high grayscale values, and thus, luminance deviation at low grayscale values may be prevented.

Third, the corresponding light emitting part further includes a reflective insulating film in a region from which the anode is removed due to the opening, thereby being capable of maintaining optical reflectance and thus maintaining optical balance with the light emitting parts of other colors.

Fourth, the opening provided to compensate for an efficiency difference between colors at low grayscale values is set to have a designated width or less, and thus, does not cause an increase in driving voltage and maintains a potential similar to a case in which no opening is provided at high grayscale values, thereby being capable of preventing efficiency loss at high grayscale values.

It will be apparent to those skilled in the art that various modifications and variations can be made in the light emitting display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device, comprising:
a substrate comprising first subpixels, second subpixels and third subpixels;
a first anode, having at least one opening, in each of the first subpixels;
a second anode in each of the second subpixels, and a third anode in each of the third subpixels;
a reflective insulating film provided at the opening of the first anode, the reflective insulating film in contact with the first anode under the first anode;
an organic stack on each of the first anode, the second anode and the third anode; and
a cathode on the organic stack,
wherein each of the first to third anodes comprises a stack of a reflective electrode and a transparent electrode,
wherein the reflective electrode is located between the reflective insulating film and the transparent electrode at each of the first subpixels, and
wherein the reflective insulating film is provided at a smaller area than an emission region of the first anode, and the at least one opening is concentrated at a center in the first anode.

2. The light emitting display device according to claim 1, wherein the reflective insulating film is formed by stacking a first film and a second film having different refractive indices into a plurality of pairs.

3. The light emitting display device according to claim 2, wherein one of the first film and the second film is an inorganic insulating layer having at least one of oxide or nitride and the other of the first film and the second film is an inorganic insulating layer having titanium.

4. The light emitting display device according to claim 1, wherein the reflective insulating film has reflectance substantially equal to or similar to that of the reflective electrode.

5. The light emitting display device according to claim 1, wherein the at least one opening of the first anode comprises a plurality of linear-shaped openings spaced apart from each other by the same interval.

6. The light emitting display device according to claim 1, wherein the at least one opening of the first anode is provided in a radial shape from the center of the first anode.

7. The light emitting display device according to claim 1, wherein the at least one opening of the first anode comprises a plurality of dot-shaped openings.

8. The light emitting display device according to claim 1, wherein the first anode is divided by the at least one opening.

9. The light emitting display device according to claim 1, wherein the at least one opening of the first anode has a width within a range of 0.1 µm to 5 µm.

10. The light emitting display device according to claim 1, wherein the organic stack comprises a hole injection layer, a hole transport layer, an electron blocking layer, a light emitting layer, a hole blocking layer and an electron transport layer in each of the first to third subpixels, wherein:
the light emitting layer of each of the first subpixels is a green light emitting layer; and
the light emitting layer of each of the second subpixels and the light emitting layer of each of the third subpixels are a red light emitting layer and a blue light emitting layer, respectively.

11. The light emitting display device according to claim 10, wherein the organic stack in the first and second subpixels further comprises first and second auxiliary hole transport layers arranged between the hole transport layer and the electron blocking layer, respectively, wherein a thickness of the second auxiliary hole transport layer is greater than a thickness of the first auxiliary hole transport layer.

12. The light emitting display device according to claim 1, wherein the organic stack comprises a plurality of stacks, comprising respective light emitting layers of the same color, in addition to common layers, in each of the first to third subpixels.

13. The light emitting display device according to claim 1, wherein a number of the first subpixels arranged on the substrate is greater than a number of each of the second and third subpixels arranged thereon.

14. The light emitting display device according to claim 1, wherein the substrate further comprises fourth subpixels, wherein each of the fourth subpixels comprises a fourth anode having at least one opening formed therein.

15. The light emitting display device according to claim 1, wherein the reflective insulating film reflects a light from the organic stack to the cathode.

16. The light emitting display device according to claim 1, wherein the reflective insulating film is greater than an area of the at least one opening and smaller than an area of the first anode.

17. A light emitting display device, comprising:
- a substrate comprising first subpixels and second subpixels;
- a first anode, having at least one opening, in each of the first subpixels;
- a second anode in each of the second subpixels;
- a reflective insulating film provided at the at least one opening of the first anode;
- an organic stack on the first anode and the at least one opening at each of the first subpixels, and the second anode at each of the second subpixels; and
- a cathode on the organic stack,
- wherein the reflective insulating film has reflectance substantially equal to or similar to that of first anode at each of the first subpixels,
- wherein each of the first anode and the second anode comprises a stack of a reflective electrode and a transparent electrode,
- wherein the reflective electrode is located between the reflective insulating film and the transparent electrode at each of the first subpixels,
- wherein the reflective electrode comprises at least one of aluminum, aluminum alloy, silver and silver alloy, and
- wherein the reflective insulating film is provided at a smaller area than an emission region of the first anode, and the at least one opening is concentrated at a center in the first anode.

18. The light emitting display device according to claim 17, wherein the at least one opening of the first anode is configured to compensate for a color efficiency difference between the first subpixels having the at least one openings and the second subpixels without any openings at a low grayscale.

19. The light emitting display device according to claim 17, wherein the first anode includes a center region having the at least one openings and side regions having a shorter length than a length of the center region at both ends of the center region, and wherein the side regions do not include any openings.

20. A light emitting display device, comprising:
- a substrate comprising first subpixels, second subpixels and third subpixels;
- a first anode, having at least one opening, in each of the first subpixels;
- a second anode in each of the second subpixels, and a third anode in each of the third subpixels;
- a reflective insulating film provided at the opening of the first anode, the reflective insulating film in contact with the first anode under the first anode;
- an organic stack on each of the first anode, the second anode and the third anode; and
- a cathode on the organic stack,
- wherein each of the first to third anodes comprises a stack of a reflective electrode and a transparent electrode,
- wherein the reflective electrode is located between the reflective insulating film and the transparent electrode at each of the first subpixels, and
- wherein the at least one opening of the first anode is configured to compensate for a color efficiency difference between the first subpixels having the at least one openings and the second subpixels without any openings at a low grayscale.

* * * * *